United States Patent
Arvin et al.

(10) Patent No.: US 10,804,241 B2
(45) Date of Patent: Oct. 13, 2020

(54) NON-POROUS COPPER TO COPPER INTERCONNECT

(71) Applicant: International Business Machines Corporation, Armonk, NY (US)

(72) Inventors: Charles L. Arvin, Poughkeepsie, NY (US); Christopher D. Muzzy, Burlington, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/695,121

(22) Filed: Nov. 25, 2019

(65) Prior Publication Data

US 2020/0098723 A1   Mar. 26, 2020

Related U.S. Application Data

(62) Division of application No. 15/686,645, filed on Aug. 25, 2017, now Pat. No. 10,553,555.

(51) Int. Cl.
*H01L 23/12* (2006.01)
*H01L 23/00* (2006.01)
*H01L 23/498* (2006.01)

(52) U.S. Cl.
CPC ........ *H01L 24/81* (2013.01); *H01L 23/49811* (2013.01); *H01L 23/49866* (2013.01); *H01L 24/16* (2013.01); *H01L 24/13* (2013.01); *H01L 2224/13147* (2013.01); *H01L 2224/16227* (2013.01); *H01L 2224/16503* (2013.01); *H01L 2224/81026* (2013.01); *H01L 2224/81048* (2013.01); *H01L 2224/81191* (2013.01); *H01L 2224/81193* (2013.01); *H01L 2224/81411* (2013.01); *H01L 2224/81439* (2013.01); *H01L 2224/81447* (2013.01); *H01L 2224/81455* (2013.01); *H01L 2224/81895* (2013.01); *H01L 2924/20104* (2013.01); *H01L 2924/20105* (2013.01)

(58) Field of Classification Search
CPC ............... H01L 24/81; H01L 23/49811; H01L 23/49866; H01L 24/16
USPC ...................................................... 257/737
See application file for complete search history.

(56) References Cited

U.S. PATENT DOCUMENTS

| | | | |
|---|---|---|---|
| 6,720,240 B2 | 4/2004 | Gole et al. | |
| 7,524,351 B2 | 4/2009 | Hua et al. | |
| 7,880,307 B2 | 2/2011 | Farnworth et al. | |

(Continued)

OTHER PUBLICATIONS

Jonas Zurcher et al.., "Nanoparticle Assembly and Sintering Towards All-Copper Flip Chip Interconnects", 2015 Electronic Components & Technology Conference, San Diego, CA, May 26-29, 2015, all pages.

(Continued)

*Primary Examiner* — Caleb E Henry
(74) *Attorney, Agent, or Firm* — Law Offices of Ira D. Blecker, P.C.

(57) ABSTRACT

A semiconductor structure which includes a first semiconductor substrate having a first plurality of copper connectors; a second semiconductor substrate having a second plurality of copper connectors; and a joining structure joining the first plurality of copper connectors to the second plurality of copper connectors, the joining structure including a copper intermetallic mesh having pores filled with silver.

19 Claims, 3 Drawing Sheets

(56) References Cited

U.S. PATENT DOCUMENTS

| | | |
|---|---|---|
| 8,882,934 B2 | 11/2014 | Nakagawa et al. |
| 9,512,522 B2 | 12/2016 | Miao |
| 9,521,748 B1 | 12/2016 | Bergman et al. |
| 10,056,505 B2* | 8/2018 | Rantala ................. C09D 11/52 |
| 2004/0115340 A1 | 6/2004 | Griego |
| 2009/0214447 A1* | 8/2009 | Jennings ................. A61K 8/11 |
| | | 424/49 |
| 2010/0166870 A1* | 7/2010 | Iyer ........................... B01J 2/14 |
| | | 424/490 |
| 2010/0178512 A1* | 7/2010 | Giesenberg ........... C09C 1/3081 |
| | | 428/405 |
| 2011/0110864 A1* | 5/2011 | Ibanez ............... A61K 49/0093 |
| | | 424/9.6 |
| 2012/0286218 A1* | 11/2012 | Mei .......................... H01B 1/02 |
| | | 252/512 |
| 2013/0228716 A1* | 9/2013 | Suetsuna .................. B22F 1/02 |
| | | 252/62.55 |
| 2013/0228717 A1* | 9/2013 | Harada ..................... H01F 1/26 |
| | | 252/62.55 |
| 2015/0053753 A1* | 2/2015 | Komatsu ............. B23K 35/025 |
| | | 228/248.1 |
| 2016/0086728 A1* | 3/2016 | Suetsuna ................... C22C 1/00 |
| | | 148/105 |
| 2016/0328598 A1 | 11/2016 | Cheng |
| 2017/0005040 A1 | 1/2017 | Canaperi et al. |
| 2017/0058152 A1* | 3/2017 | Hardin ....................... C09J 7/10 |
| 2017/0081248 A1* | 3/2017 | Jeong ............... C04B 35/62839 |
| 2018/0239070 A1* | 8/2018 | England .................. B44F 1/066 |
| 2019/0002719 A1* | 1/2019 | Pousthomis ......... C01G 11/006 |

OTHER PUBLICATIONS

R. Dohle et al., "Electromigration Performance of Flip-Chips with Lead-Free Solder Bumps between 30 µm and 60 µm Diameter," International Symposium on Microelectronics, 2012, pp. 891-905.

T. Oppert et al., "Wafer Level Solder Bumping and Flip Chip Assembly with Solder Balls Down to 30µm," International Symposium on Microelectronics, 2011, pp. 953-960.

* cited by examiner

NON-POROUS COPPER TO COPPER INTERCONNECT

BACKGROUND

The present exemplary embodiments pertain to copper interconnects between two semiconductor substrates.

Interconnects between two semiconductor substrates, for example between a semiconductor device and a chip carrier, formed only by copper mitigate the electromigration risk that may occur when the two semiconductor substrates are joined by a solder alloy. Further, there is a desire for both first and second level assembly to create low temperature joints.

BRIEF SUMMARY

The various advantages and purposes of the exemplary embodiments as described above and hereafter are achieved by providing, according to an aspect of the exemplary embodiments, a semiconductor structure comprising: a first semiconductor substrate having a first plurality of copper connectors; a second semiconductor substrate having a second plurality of copper connectors; and a joining structure joining the first plurality of copper connectors to the second plurality of copper connectors, the joining structure comprising a copper intermetallic mesh having pores filled with silver.

According to another aspect of the exemplary embodiments, there is provided a semiconductor structure comprising: a first semiconductor substrate having a first plurality of copper connectors; a second semiconductor substrate having a second plurality of copper connectors; and a joining structure joining the first plurality of copper connectors to the second plurality of copper connectors, the joining structure comprising an intermetallic mesh having pores filled with silver, the intermetallic mesh comprising copper to copper bonds and copper to copper/tin alloy bonds.

According to a further aspect of the exemplary embodiments, there is provided a semiconductor structure comprising: a first semiconductor substrate having a first plurality of copper connectors extending from a surface of the first semiconductor substrate; a second semiconductor substrate having a second plurality of copper connectors extending from a surface of the second semiconductor substrate; and a joining structure joining the first plurality of copper connectors to the second plurality of copper connectors, the joining structure consisting of an intermetallic mesh having pores filled with silver, the intermetallic mesh comprising copper to copper bonds and copper to copper/tin alloy bonds.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 4A to 4D are cross sectional views of process steps for forming a structure in which a copper intermetallic mesh with pores filled with silver joins two semiconductor substrates in which:

FIG. 4A depicts first and second semiconductor substrates with a dispersion of nano-sized spheres in a liquid dispensed on the first semiconductor substrate;

FIG. 4B depicts the first and second semiconductor substrates being moved into contact;

FIG. 4C depicts the dispersion of nano-sized spheres between the first and second semiconductor substrates after evaporation of the liquid of the dispersion; and FIG. 4D depicts the first and second semiconductor substrates being joined together after a heating process in which the dispersion of nano-sized spheres forms a copper intermetallic mesh having pores filled with silver.

DETAILED DESCRIPTION

Semiconductor substrates may be joined by nano-sized copper particles which are applied to the semiconductor substrates and then heated to form a porous metallic mesh.

The porous metallic mesh may lead to an opportunity for corrosion of the joint which expands the connections and cracks it. There may also be a potential fail for a drop test and/or a reduction in the total area for current carrying capability.

The present inventors propose a method and structure whereby nano-copper joining of semiconductor substrates at low temperatures is enabled but with a metallic mesh structure that does not have the unfilled porosity of the porous metallic mesh.

Figure 1:
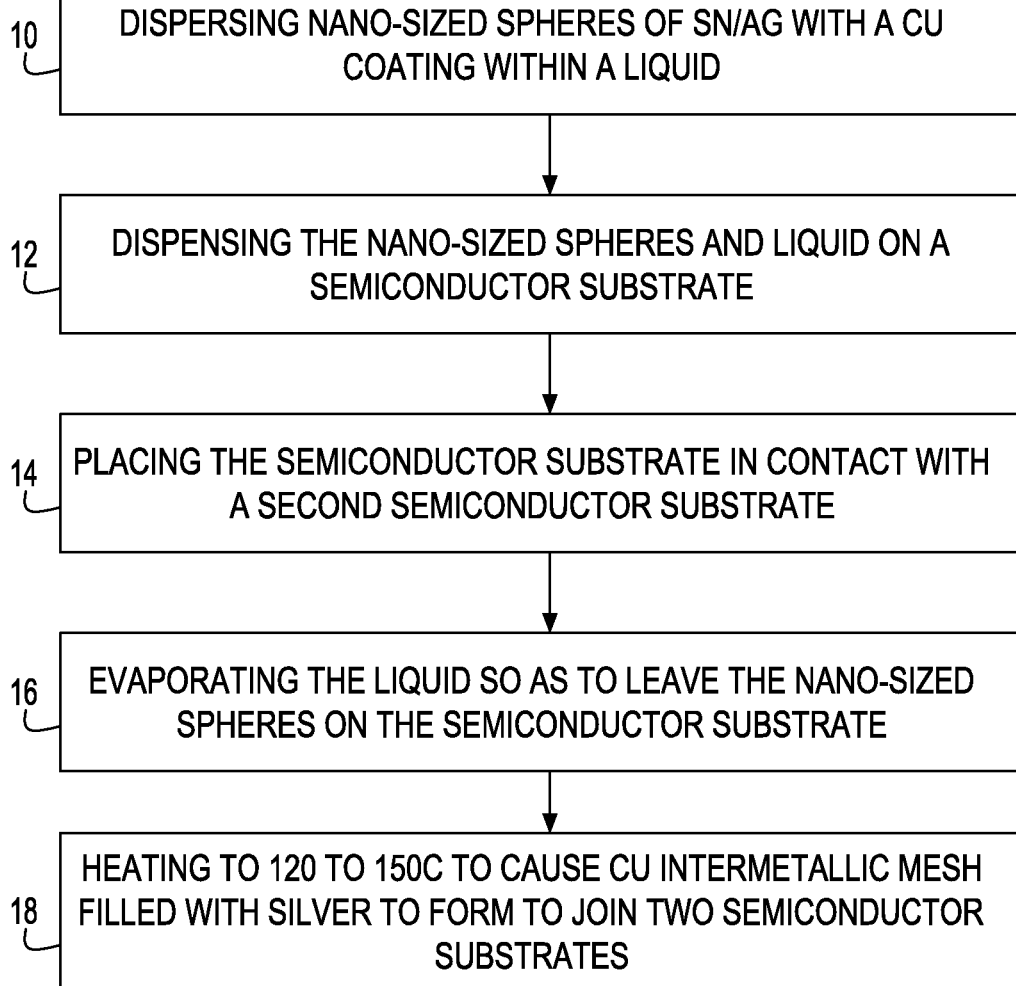
FIG. 1 is a flow chart of a method for manufacturing a copper intermetallic mesh with pores filled with silver that joins two substrates.

Referring to the Figures in more detail, and particularly referring to FIG. 1, there is illustrated a method for manufacturing a copper intermetallic mesh with pores filled with silver that joins two substrates.

Nano-sized spheres of a tin/silver alloy having a copper coating are dispersed within a liquid, box 10. This liquid is a viscous liquid that maintains the dispersion of the nano-sized spheres. For the purpose of illustration and not limitation, the viscous liquid may comprise isopropanolamine. Non-copper bound isopropanolamine evaporates but a small amount remains attached to the copper nano-particle surface. Some is converted to copper formate. This small amount of material along with copper to copper interactions as the copper particles approach one another and exceed the critical coagulation concentration leads to a stable sol between two interfaces, such as between two semiconductor substrates.

Figures 2, 3:
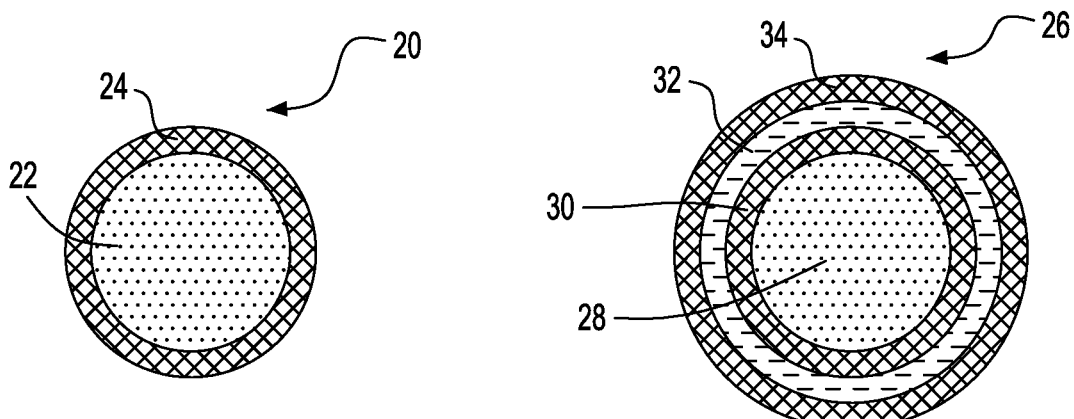
FIG. 2 is a cross-sectional view of an exemplary embodiment of a nano-sized sphere of a tin/silver core having a coating of copper.
FIG. 3 is a cross-sectional view of another exemplary embodiment of a nano-sized sphere of a tin/silver core having a coating of copper, nickel and copper.

In one exemplary embodiment, nano-sized tin/silver spheres coated with copper may be used. Referring now to FIG. 2, there is illustrated a cross section of a nano-size sphere 20 of a tin/silver alloy core 22 having a copper coating 24. The tin/silver alloy core 22 may have a diameter of 20 to 100 nanometers (nm) with the copper coating 24 having a thickness of 5 to 10 nm. The tin/silver alloy may have a composition, in weight percent, of 0.5 to 3.0% silver, remainder tin. More preferably, the tin/silver alloy may have a composition, in weight percent, of 1.4 to 2.0% silver, remainder tin. In another exemplary embodiment, the tin/silver alloy core 22 may also include 0.1 to 1.0 weight percent copper. In this case, the Ag concentration can range, in weight percent, from 0.1 to 3.0% silver.

In another exemplary embodiment, nano-sized tin/silver spheres coated with copper, nickel and copper again may be used. Referring now to FIG. 3, there is illustrated a cross section of a nano-size sphere 26 of a tin/silver alloy core 28 having a first copper coating 30, a nickel coating 32 and a second copper coating 34. The tin/silver alloy core 28 may have the same size and composition as tin/silver alloy core 22 in FIG. 2 and, in another exemplary embodiment, the tin/silver alloy core 28 may include copper as indicated above. The first copper coating 30, the nickel coating 32 and the second copper coating 34 may each have a thickness of 5 to 10 nm.

The tin/silver alloy cores 22, 26 may be coated with copper by immersing the tin/silver alloy cores 22 in a solution of copper sulfate, sulfuric acid and hydrochloric acid. For the tin/silver alloy core 26, the nickel coating may be applied by an electroless nickel bath or by a nickel/boron bath.

In a preferred exemplary embodiment, the outer coating 24 and 34 on each of the nano-sized spheres 20 and 26 may be copper to allow copper to copper bonding with each of the semiconductor substrates to be joined.

Referring back to FIG. 1, the nano-sized spheres 20, 26 and liquid may be dispensed, box 12, such as by spraying or dipping, onto at least one semiconductor substrate and preferably dispensed onto both semiconductor substrates to be joined.

Figure 4A:
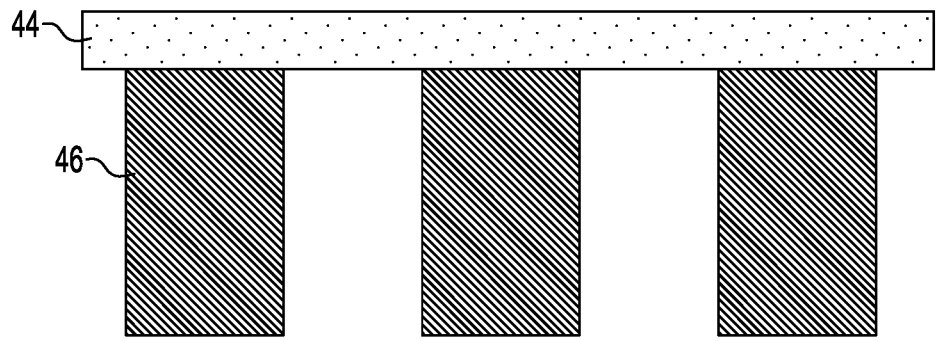
Figure 4A:
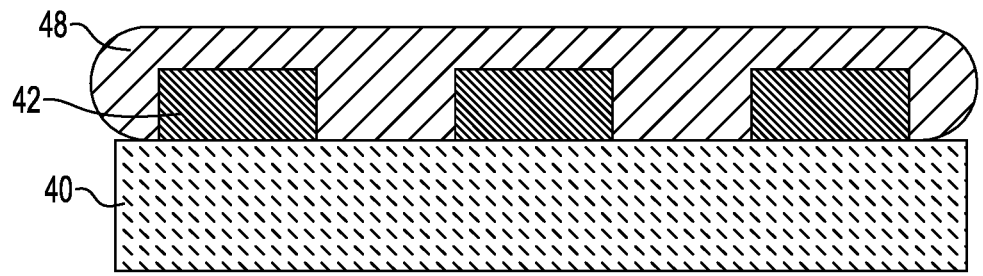

Referring now to FIG. 4A, there is shown a first semiconductor substrate 40 having a first plurality of copper connectors 42 and a second semiconductor substrate 44 having a second plurality of copper connectors 46. For purposes of illustration and not limitation, first semiconductor substrate 40 may be a chip carrier, such as an organic laminate chip carrier, and second semiconductor substrate 44 may be a semiconductor device (also referred to as a chip). It is also within the scope of the exemplary embodiments for the second semiconductor substrate 44 to be a chip carrier, such as an organic laminate chip carrier, and the first semiconductor substrate 40 to be the next level of packaging such as a mother board.

For the purpose of illustration and not limitation, the first plurality of copper connectors 42 may be studs or pads (studs are taller than pads) and the second plurality of copper connectors 46 may be pads or pillars (pillars are taller than pads). If the second semiconductor substrate 44 is a semiconductor device, then the second plurality of copper connectors 46 are pillars and the first plurality of copper connectors 42 may be pads and preferably are studs. For the purpose of illustration and not limitation, the pads may have a height less than 20 microns (μm), the studs may have a height of 20 to 30 μm and the pillars may have a height greater than 30 μm, for example, 50 to 70 μm. In addition, each of the pads, studs and pillars may have a diameter ranging from 10 um to 125 um. The nominal diameter value is dependent upon the pitch needed for each application. Since there can be multiple pitches on the same semiconductor device, there is not one preferred diameter for those applications.

Also shown in FIG. 4A is the dispersion 48 of nano-sized spheres 20, 26 and liquid which has been dispensed only on the first semiconductor substrate 40 and first plurality of copper connectors 42. In some exemplary embodiments, it may be preferable to dispense the dispersion 48 of nano-sized spheres 20, 26 and liquid on both the first semiconductor substrate 40 and second semiconductor substrate 44.

The semiconductor substrates are placed into contact, box 14 (FIG. 1).

Figure 4B:
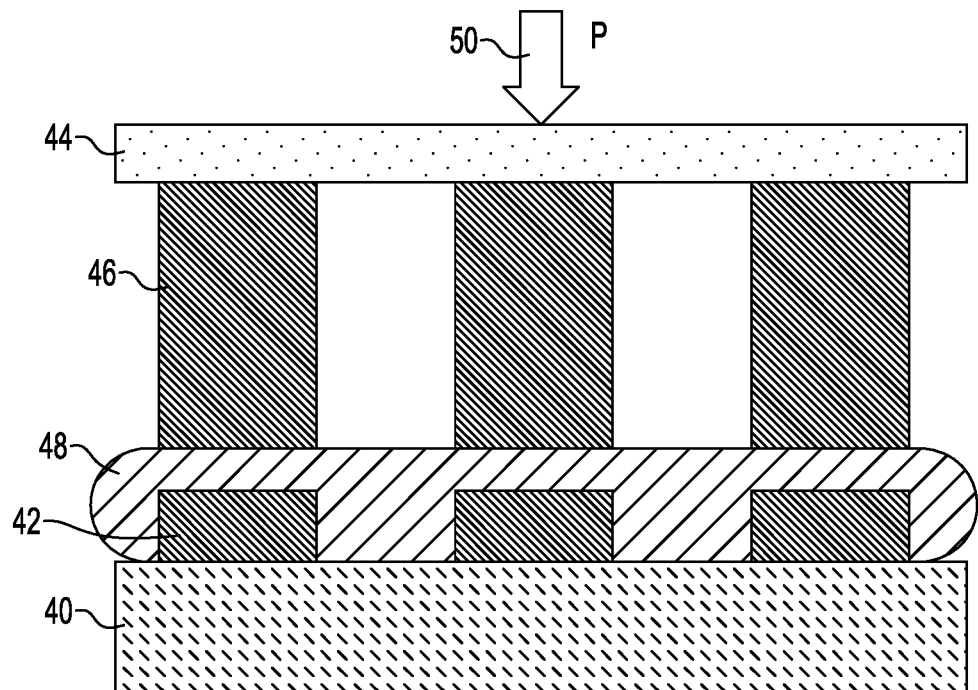

Referring to FIG. 4B, first semiconductor substrate 40 and second semiconductor substrate 44 have been moved into contact. In some exemplary embodiments, there may be direct contact between the first plurality of copper connectors 42 and the second plurality of copper connectors 46. In other exemplary embodiments, as shown in FIG. 4B, there may be contact between the first plurality of copper connectors 42 and the second plurality of copper connectors 46 through the dispersion 48 of nano-sized spheres 20, 26 and liquid.

Force may also be applied, as indicated by arrow 50, to ensure appropriate contact between the first plurality of copper connectors 42 and the second plurality of copper connectors 46. The amount of force applied may be dependent on the number of bonds and the size of the features being joined but, for the purpose of illustration and not limitation, 0.5-30N (newtons) would be a typical working range.

The viscous liquid is evaporated by heating above 80° C. The heating time is dependent upon the form factor being used as the form factor controls the mass of the materials to be removed but a heating time above 80° C. for 8 minutes will be adequate for most applications, box 16 (FIG. 1). As a consequence of the viscous liquid evaporating and the interaction of the amine group with copper, the evaporating viscous liquid moves to the joining surface pulling the nano-sized spheres 20, 26 with it so as to leave the nano-sized spheres 20, 26 on the semiconductor substrate that has received the viscous liquid dispensed on it. More particularly, the nano-sized spheres 20, 26 having a copper coating 24, 34 are drawn to copper surfaces which in the exemplary embodiments may be the first plurality of copper connectors 42 and the second plurality of copper connectors 46.

Figure 4C:
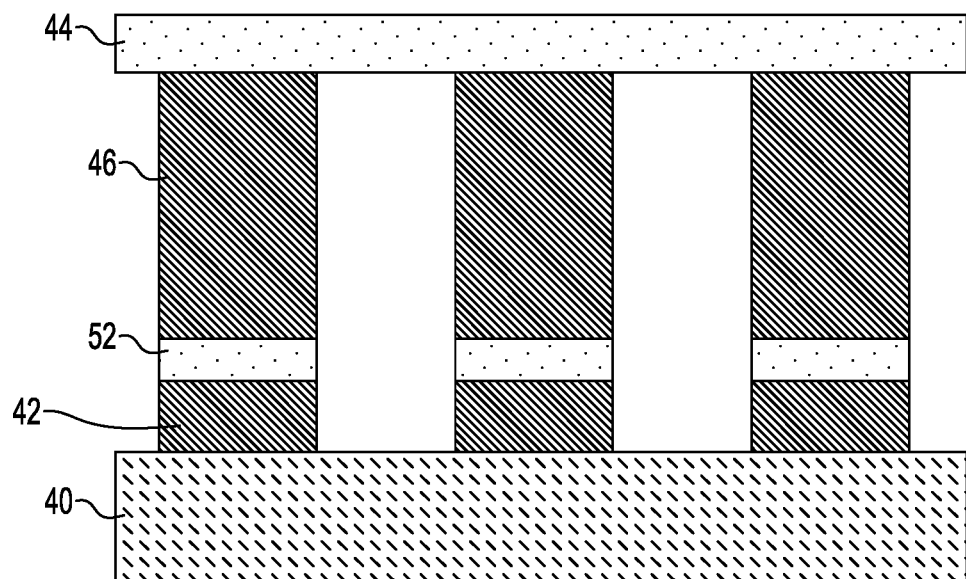

Referring now to FIG. 4C, the viscous liquid of the dispersion 48 has been evaporated leaving the nano-sized spheres 52. There may also be a binder to hold the nano-sized spheres 52 together until sintering of the nano-sized spheres occurs in a later process.

Belt furnaces may be used for heating which have limited times available to produce an effective joint that requires more than simple soldering or brazing applications. As such, a low temperature joining step is needed such as 145 to 160° C. for about 8 minutes to cause the semiconductor substrates to become weakly joined. This low temperature joining step enables the parts to have a stable sol and small amounts of copper to copper chemical bonds to hold the semiconductor substrates in place to be moved to a subsequent solid state transformation of the final joint. If one were to utilize equipment such as thermal compression bonding which is one part driven or sacrifice throughput on belt furnaces, it would be possible to combine the evaporation and mass transport step of the nano-sized spheres and the solid state transformation of those spheres to a final joint in one tool and one ramp rate.

For those applications requiring the two step process, the low temperature joining step may be followed by an extended bake at 120-150° C. for 1 to 20 hours, box 18 (FIG. 1). During this extended bake, the nano-sized spheres transform by a solid state process to form an intermetallic mesh of copper and an alloy of copper/tin. In the embodiment where the nano-sized spheres 26 of FIG. 3 are utilized, the intermetallic mesh may also include nickel. An intermetallic material is a solid-state compound exhibiting metallic bonding and may be an alloy. The intermetallic mesh so formed is porous but in the exemplary embodiments, the silver from the tin/silver core 22, 28 of the nano-sized spheres 20, 26 fills the pores of the intermetallic mesh.

During the extended bake process, copper to copper bonds and copper to copper/tin alloy bonds may occur which form the intermetallic mesh. Again, in the embodiment where the nano-sized spheres 26 of FIG. 3 are utilized, the intermetallic mesh may also include nickel. As a result of the extended bake process, a porous intermetallic mesh is formed. As noted earlier, the porosity may be undesirable. Accordingly, in the exemplary embodiments, the silver from the original tin/silver cores 22, 28 fills the intermetallic mesh so that it is no longer porous. Ideally, there is no porosity left after the silver fills the intermetallic mesh.

Figure 4D:
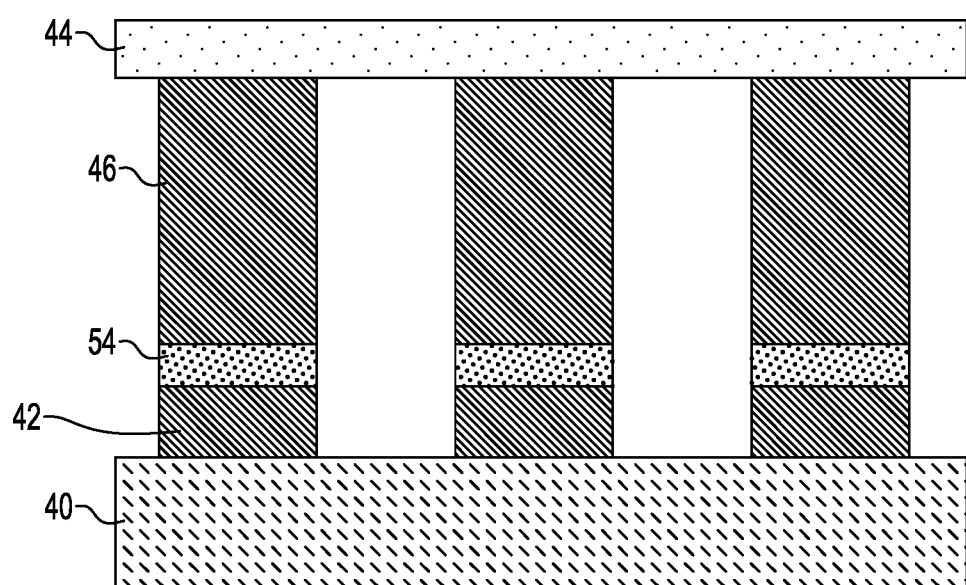

Referring now to FIG. 4D, the semiconductor structure is shown after the extended bake process such that the joining structure 54 of a copper intermetallic mesh having pores filled with silver joins the first plurality of copper conductors 42 to the second plurality of copper conductors 46. As noted previously, the copper intermetallic mesh may also comprise a copper/tin alloy and, if nano-sized sphere 26 is utilized, nickel.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A semiconductor structure comprising:
a first semiconductor substrate having a first plurality of copper connectors;
a second semiconductor substrate having a second plurality of copper connectors; and
a joining structure joining the first plurality of copper connectors to the second plurality of copper connectors, the joining structure comprising a copper intermetallic mesh having pores filled with silver.

2. The semiconductor structure of claim 1 wherein the joining structure is only between each of the first plurality of copper connectors joined to a corresponding each of the second plurality of copper connectors.

3. The semiconductor structure of claim 1 wherein the first semiconductor substrate is a semiconductor chip and the second semiconductor substrate is a semiconductor chip carrier.

4. The semiconductor structure of claim 1 wherein the first semiconductor substrate is a semiconductor chip carrier and the second semiconductor substrate is a next level semiconductor package.

5. The semiconductor structure of claim 1 wherein the first plurality of copper conductors are pillars and the second plurality of copper conductors are pads.

6. The semiconductor structure of claim 1 wherein the copper intermetallic mesh further comprising an alloy of copper and tin.

7. The semiconductor structure of claim 6 wherein the copper intermetallic mesh further comprising nickel.

8. A semiconductor structure comprising:
a first semiconductor substrate having a first plurality of copper connectors;
a second semiconductor substrate having a second plurality of copper connectors; and
a joining structure joining the first plurality of copper connectors to the second plurality of copper connectors, the joining structure comprising an intermetallic mesh having pores filled with silver, the intermetallic mesh comprising copper to copper bonds and copper to copper/tin alloy bonds.

9. The semiconductor structure of claim 8 wherein the joining structure is only between each of the first plurality of copper connectors joined to a corresponding each of the second plurality of copper connectors.

10. The semiconductor structure of claim 8 wherein the first semiconductor substrate is a semiconductor chip and the second semiconductor substrate is a semiconductor chip carrier.

11. The semiconductor structure of claim 8 wherein the first semiconductor substrate is a semiconductor chip carrier and the second semiconductor substrate is a next level semiconductor package.

12. The semiconductor structure of claim 8 wherein the first plurality of copper conductors are pillars and the second plurality of copper conductors are pads.

13. The semiconductor structure of claim 8 wherein the intermetallic mesh further comprising nickel.

14. A semiconductor structure comprising:
a first semiconductor substrate having a first plurality of copper connectors extending from a surface of the first semiconductor substrate;
a second semiconductor substrate having a second plurality of copper connectors extending from a surface of the second semiconductor substrate; and
a joining structure joining the first plurality of copper connectors to the second plurality of copper connectors, the joining structure consisting of an intermetallic mesh having pores filled with silver, the intermetallic mesh comprising copper to copper bonds and copper to copper/tin alloy bonds.

15. The semiconductor structure of claim 14 wherein the joining structure is only between each of the first plurality of copper connectors joined to a corresponding each of the second plurality of copper connectors.

16. The semiconductor structure of claim 14 wherein the first semiconductor substrate is a semiconductor chip and the second semiconductor substrate is a semiconductor chip carrier.

17. The semiconductor structure of claim 14 wherein the first semiconductor substrate is a semiconductor chip carrier and the second semiconductor substrate is a next level semiconductor package.

18. The semiconductor structure of claim 14 wherein the first plurality of copper conductors are pillars and the second plurality of copper conductors are pads.

19. The semiconductor structure of claim 14 wherein the intermetallic mesh further comprising nickel.

* * * * *